United States Patent [19]

Mochizuki et al.

[11] 4,062,707
[45] Dec. 13, 1977

[54] UTILIZING MULTIPLE POLYCRYSTALLINE SILICON MASKS FOR DIFFUSION AND PASSIVATION

[75] Inventors: Hidenobu Mochizuki, Atsugi; Teruaki Aoki, Tokyo; Takeshi Matsushita, Sagamihara; Hisao Hayashi; Masanori Okayama, both of Atsugi, all of Japan

[73] Assignee: Sony Corporation, Tokyo, Japan

[21] Appl. No.: 654,598

[22] Filed: Feb. 2, 1976

[30] Foreign Application Priority Data

Feb. 15, 1975 Japan .................................. 50-19353

[51] Int. Cl.$^2$ ...................... H01L 21/22; H01L 21/31
[52] U.S. Cl. ...................................... 148/187; 29/571; 29/578; 148/174; 357/52; 357/54; 357/59; 357/23; 427/86; 427/94; 427/95; 427/248 A; 427/93
[58] Field of Search .................. 148/174, 187; 357/54, 357/59, 52; 29/578, 580, 571; 427/86, 93, 94, 95, 126, 248

[56] References Cited

U.S. PATENT DOCUMENTS

| | | | |
|---|---|---|---|
| 3,341,381 | 9/1967 | Bergmann et al. | 148/187 |
| 3,372,067 | 3/1968 | Schafer | 148/187 |
| 3,422,321 | 1/1969 | Tombs | 427/94 X |
| 3,455,020 | 7/1969 | Dawson et al. | 29/578 X |
| 3,463,715 | 8/1969 | Bloom | 148/174 X |
| 3,472,689 | 10/1969 | Scott | 427/93 X |
| 3,479,237 | 11/1969 | Bergh et al. | 148/187 X |
| 3,485,666 | 12/1969 | Sterling et al. | 427/94 X |
| 3,549,411 | 12/1970 | Bean et al. | 427/94 X |
| 3,649,884 | 3/1972 | Haneta | 357/54 X |
| 3,709,726 | 1/1973 | Nuttall | 427/94 |
| 3,862,852 | 1/1975 | Kamins | 427/93 X |
| 3,971,061 | 7/1976 | Matsushita et al. | 357/54 X |
| 3,977,019 | 8/1976 | Matsushita et al. | 357/52 X |

FOREIGN PATENT DOCUMENTS

| | | | |
|---|---|---|---|
| 300,472 | 4/1968 | Sweden | 357/52 X |
| 1,164,418 | 9/1969 | United Kingdom | 148/187 |

OTHER PUBLICATIONS

Steinmaier et al, "Successive Growth of Si and SiO$_2$ . . . . 38 J. Electrochem. Soc., vol. 111, No. 2, Feb. 1964, pp. 206–209.

Tombs et al., "Silicon Oxide as an Etching Mask for Silion Nitride" J. Electrochem. Soc., vol. 115, No. 1, Jan. 1968, pp. 101–102.

ABOAF, J.A., "Some Properties of Vapor Deposited Silion Nitride . . . " J. Electrochem. Soc., vol. 116, No. 12, Dec. 1969, pp. 1736–1740.

*Primary Examiner*—L. Dewayne Rutledge
*Assistant Examiner*—W. G. Saba
*Attorney, Agent, or Firm*—Hill, Gross, Simpson, Van Santen, Steadman, Chiara & Simpson

[57] ABSTRACT

A method for fabricating a semiconductor device includes the steps of forming a first polycrystalline silicon layer containing oxygen atoms on a semiconductor layer, of forming a second polycrystalline silicon layer containing nitrogen atoms on the first polycrystalline silicon layer, of removing a predetermined part of the first and second polycrystalline silicon layers to form an opening therein, and of diffusing impurity material into the semiconductor layer through the opening in order to form a diffused region. The fabricating process can be remarkably simplified.

3 Claims, 12 Drawing Figures

UTILIZING MULTIPLE POLYCRYSTALLINE SILICON MASKS FOR DIFFUSION AND PASSIVATION

CROSS REFERENCE TO RELATED APPLICATIONS OF THE SAME ASSIGNEE

Cross reference is made to application, Ser. No. 561,532, filed Mar. 24, 1975, now U.S. Pat. No. 4,014,037 based on an application in Japan dated Mar. 30, 1974. This application is now pending, has been allowed, and the Base Issue Fee paid. Reference is also made to application, Ser. No. 624,889, filed Oct. 22, 1975, based on an application filed in Japan Oct. 26, 1974. This application is pending.

BACKGROUND OF THE INVENTION

1. Field of the Invention

This invention relates to a method for fabricating a semiconductor device, and more particularly to a method most suitable for fabricating a diode, a transistor, an FET and integrated circuits, of the selective diffusion type in which a mask for impurity diffusion is used also as a passivation layer.

2. Description of the Prior Art

Hitherto, a $SiO_2$ layer is used as a mask for impurity diffusion in the fabrication of a semiconductor device of the above-described type. The $SiO_2$ layer remains on the semiconductor substrate, as a passivation layer. See, for example, U.S. Pat. No. 3,971,061 and U.S. Pat. No. 3,064,167. However, from the view-point of the characteristics of the semiconductor device, the $SiO_2$ layer is so unstable against moisture that the leakage current changes under high humidity and that the reliability is deteriorated. Moreover, the semiconductor device using the $SiO_2$ layer as the passivation layer has the disadvantage that it is deteriorated with the variations of electrical bias and temperature.

FURTHER REFERENCE TO RELATED APPLICATIONS

Some of the above described difficulties have been overcome by the semiconductor device disclosed in application, Ser. No. 561,532, or by the semiconductor device disclosed in application, Ser. No. 624,889 in which a first passivation layer of polycrystalline silicon containing oxygen atoms is formed on a semiconductor substrate, such a first passivation layer combined with a second passivation layer, for example, a polycrystalline silicon layer containing nitrogen atoms, which is more resistive against moisture than the $SiO_2$ layer, is formed on the first passivation layer, and preferably a $SiO_2$ layer is further formed on the second passivation layer the said application Ser. 624,889 filed Oct. 22, 1975. In the fabrication of a transistor as one example of such a semiconductor device, impurities are diffused into the semiconductor substrate to form a base region and an emitter region therein, by using the $SiO_2$ masking layer formed on the semiconductor substrate, next the $SiO_2$ masking layer is removed from the semiconductor substrate, the first passivation layer and then the second passivation layer are formed on the semiconductor substrate by a vapor growth method, and then the first and second passivation layers are partially etched to form openings for depositing electrodes on the emitter region and base region. Such a method has the disadvantage that the fabricating process is complicated since the first and second passivation layers are applied after removing the masking layer.

SUMMARY OF THE INVENTION

Accordingly, it is an object of this invention to provide a method for fabricating a semiconductor device which overcomes the above-described disadvantages and moreover by which the merits of the already proposed semiconductor are maintained.

Another object of this invention is to provide a method for fabricating a semiconductor device which is simplified in process.

A further object of this invention is to provide a method for fabricating a semiconductor device by which a semiconductor device having high stability and reliability can be produced.

In accordance with an aspect of this invention, a first polycrystalline silicon layer containing oxygen atoms is formed on a semiconductor substrate, a second polycrystalline silicon layer containing nitrogen atoms is formed on the first polycrystalline silicon layer, a predetermined part of the first and second polycrystalline silicon layers is removed to form an opening extending to the surface of the semiconductor substrate, impurities are diffused into the semiconductor substrate through the opening, and the first and second polycrystalline silicon layers remain on the semiconductor substrate after the diffusion operation.

DESCRIPTION OF THE PREFERRED EMBODIMENTS

FIG. 1A to FIG. 1E show one embodiment of this invention, as applied to a high break-down voltage transistor.

Figure 1A:
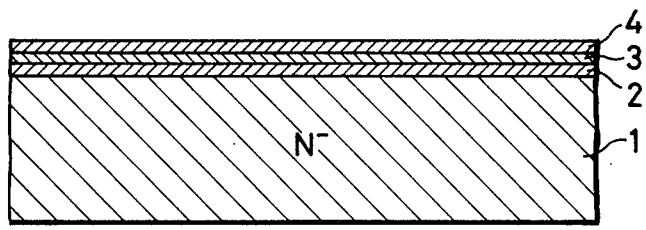
FIG. 1A to FIG. 1E are sectional views in elevation showing progressive stages of a transistor according to one embodiment of this invention.
Figure 1B:
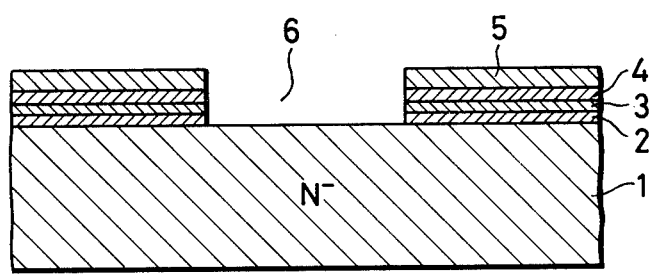

As shown on FIG. 1A, a polycrystalline silicon layer 2 as a first passivation layer, containing a predetermined quantity of oxygen atoms, is formed on the main surface of an N-type semiconductor substrate 1 as a collector region. A polycrystalline silicon layer 3 as a second passivation layer, containing a predetermined quantity of nitrogen atoms, is formed on the polycrystalline silicon layer 2. And a polycrystalline silicon layer 4 containing a predetermined quantity of oxygen atoms is formed on the polycrystalline silicon layer 3. The polycrystalline silicon layery 2, 3 and 4 are formed by a vapor growth method.

As described later, there are preferable ranges of the contents of oxygen atoms, and nitrogen atoms, and the thicknesses, of the polycrystalline silicon layers 2, 3 and 4. For example, the thickness of the polycrystalline silicon layer 2 is about 5000 A. The content of oxygen atoms thereof is about 15 atomic percent. The thickness of the polycrystalline silicon layer 3 is about 1500 A. The content of nitrogen atom thereof is about 50 atomic percent. And the thickness of the polycrystalline silicon layer 4 is about 5000 A. The content of oxygen atoms thereof is about 15 atomic percent. The polycrystalline silicon layers 2, 3 and 4 can be successively formed by an apparatus shown on FIG. 2. The details will be described later.

Next, an etching resist 5 having a predetermined pattern is deposited on the uppermost polycrystalline silicon layer 4. By using the etching resist 5 as a masking layer, the polycrystalline silicon layers 4, 3 and 2 are partially plasma-etched to form an opening 6 for base diffusion, as shown on FIG. 1B. Instead of the plasma-etching, chemical etching solutions may be used. For example, a pyrophosphoric acid is used for the polycrystalline silicon layer 3, and a mixed solution of hydrofluoric acid and nitric acid is used for the polycrystalline silicon layers 4 and 2.

Figure 1C:
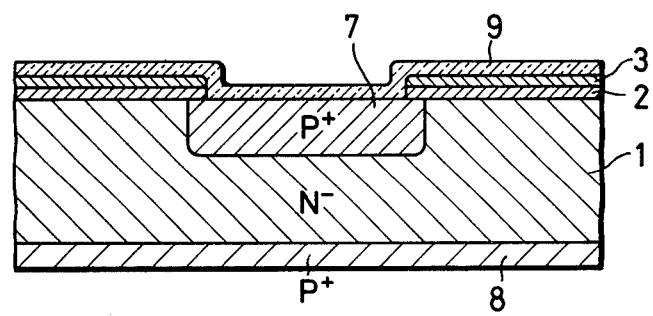

Next, boron atoms are pre-deposited on or prediffused into the semiconductor substrate 1 through the opening 6 at the temperature of 940° C and then diffused into the semiconductor substrate 1 through the opening 6 at the temperature of 1240° C in the atmosphere of $O_2$ gas for ten hours to form a P+-type base region 7, as shown on FIG. 1C. In that diffusion operation, a P+-type semiconductor layer 8 is formed on the bottom surface of the semiconductor substrate 1. The layer 8 is removed by etching before the following emitter diffusion. In the base diffusion, the polycrystalline silicon layer 4 functions as a stopper, and it is changed into a $SiO_2$ layer 9 as a third passivating layer in the atmosphere of $O_2$ gas.

Figure 1D:
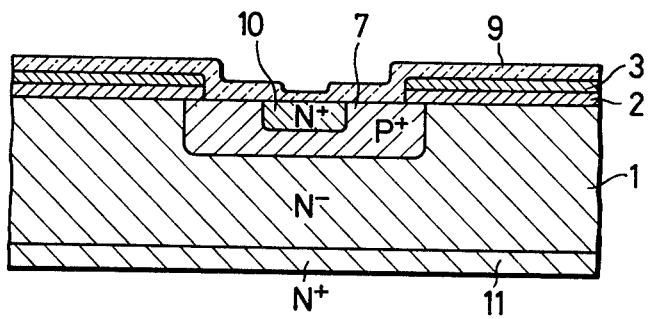
Figure 1E:
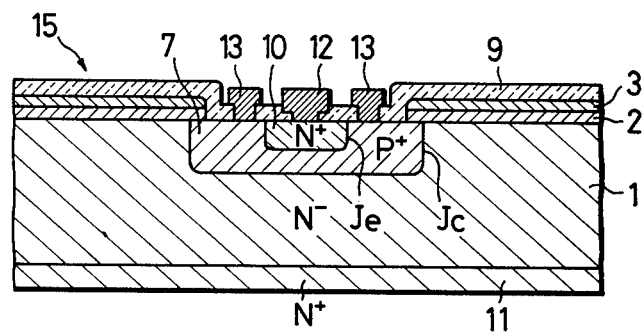

Next, a predetermined part of the $SiO_2$ layer 9 is removed to form an opening (not shown) for emitter diffusion by a conventional photoetching method. Phosphorus atoms are diffused into the base region 7 through the opening to form an N+-type emitter region 10, as shown in FIG. 1D. In the operation of the emitter diffusion, the phosphorus atoms are pre-deposited or pre-diffused into the base region 7 at the temperature of 1150° C, and then diffused thereinto at the temperature of 1240° C for 1 hour in the atmosphere of $O_2$ gas. As the result, a thin $SiO_2$ layer is formed on the emitter region 10, contiguously to the $SiO_2$ layer 9. At the same time, an N+-type semiconductive layer 11 is formed on the bottom surface of the semiconductor substrate 1. In the operation of the emitter diffusion, the $SiO_2$ layer 9 functions as a perfect stopper for the diffusion of phosphorus atoms. When a low break-down voltage transistor for high frequency is fabricated, the $SiO_2$ layer 9 is not required for the stopper, but the polycrystalline silicon layer 3 can function as a satisfactory stopper for the diffusion of phosphorus atoms. Accordingly, the polycrystalline silicon layer 4 does not need to be initially formed in the fabrication of the low break-down voltage transistor. However, the polycrystalline silicon layer 4, namely the $SiO_2$ layer 9 needs to be formed in the fabrication of the high break-down voltage transistor.

Next, the $SiO_2$ layer 9 is partially etched to form openings therein by the photo-etching method. The openings are filled with an emitter electrode 12 and a base electrode 13, as shown on FIG. 1E. Although not shown on FIG. 1E, a collector electrode is attached to the semiconductor substrate 1 as the collector region.

Figure 2:
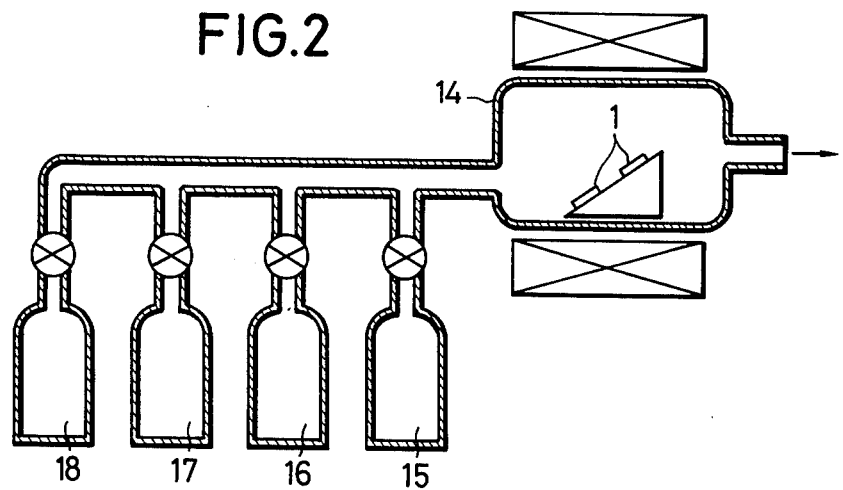
FIG. 2 is a schematic view of a vapor growth apparatus used for forming a polycrystalline silicon layer containing oxygen atoms and a polycrystalline silicon layer containing nitrogen atoms.

Next, a method for forming the above-mentioned passivating layers 2, 3 and 4 on the semiconductor substrate 1 will be described with reference to FIG. 2. The apparatus of FIG. 2 is normally used for a Chemical Vapor Deposition method. A furnace 14 of the apparatus is connected to plural tanks 15, 16, 17 and 18 for feeding predetermined gases through suitable valves and flow-meters. The furnace 14 contains the semiconductor substrates 1. The semiconductor substrate 1 is heated in the temperature of about 650° C by a heater surrounding the furnace 14. The temperature of about 650° C is for the case that mono-silane $SiH_4$ is used as a supply source of silicon. When anyother silane gas is used as a supply source of silicon, a heating temperature is determined in consideration of the reaction temperature of the gas. Mono-silane $SiH_4$ from the first tank 15, nitrogen oxide, for example, dinitrogen monoxide $N_2O$ from the second tank 16, ammonia $NH_3$ from the third tank 17, and nitrogen gas $N_2$ as a carrier gas from the fourth tank 18 are fed to the furnace 14, respectively. In this case, an inert gas containing 5 percent of mono-silane $SiH_4$ is fed to the furnace 14 from the tank 15.

Mono-silane $SiH_4$ and dinitrogen monoxide $N_2O$ are fed onto the semiconductor substrates 1 together with the carrier gas for the formation of the first passivating layer 2 shown in FIG. 1A. The concentration of oxygen in the produced polycrystalline silicon layer 2 is determined by the flow ratio of $N_2O$ to $SiH_4$. In this embodiment, the flow ratio of $N_2O$ to $SiH_4$ is about 1/6 and the polycrystalline silicon layer 2 containing about 15 atomic percent of oxygen is formed. Instead of $N_2O$, $NO_2$ or $NO$ may be used to supply oxygen into the polycrystalline silicon layer. The flow rate of $NO_2$ or $NO$ can be easily controlled to obtain the preferable concentration of oxygen.

In order to continuously form the second polycrystalline silicon layer 3 on the first polycrystalline silicon layer 2, ammonia $NH_3$ is fed instead of dinitrogen monoxide $N_2O$.

The second polycrystalline silicon layer 3 is grown at the same temperature 650° C as the first polycrystalline silicon layer 2. The concentration of nitrogen atoms in the grown polycrystalline silicon layer 3 is determined by the flow ratio of $NH_3$ to $SiH_4$. In this embodiment, the flow ratio of $NH_3$ to $SiH_4$ is about 100/30 for the formation of the second polycrystalline silicon layer 3.

Particularly, it is required that the exposed part of the collector junction Jc, which is reverse-biased in operation, is covered with the polycrystalline silicon layer 2. When a P-type semiconductive region (not shown) is formed as a guard ring for the transistor having high breakdown voltage, the polycrytalline silicon layer 2 is so wide as to cover not only the exposed part of the collector junction Jc, but also the extended area of the depletion layer formed when the collector junction Jc is reverse-biased, which is called "guard ring region" or "field-limiting region", namely the upper surface of the P-type semiconductive region and the whole area between the collector region 1 and the P-type semiconductive region. The exposed part of the emitter junction Je may be covered directly with a normal $SiO_2$ layer. However in that case, the manufacturing steps are increased more or less. The polycrystalline silicon layer 3 as the second passivating layer is at least so wide as to cover the polycrystalline silicon layer 2 as the first passivating layer.

In this embodiment, the polycrystalline silicon layer containing oxygen atoms functions as the stopper for the diffusion of boron atoms, and the $SiO_2$ layer changed from the polycrystalline silicon layer functions as the stopper for the diffusion of phosphorus atoms. In the fabrication of the semiconductor device, the electrodes are deposited on the emitter region and the base region in the condition that the polycrystalline silicon layer and the SiO₂ layer functioning as the diffusion mask remain on the semiconductor substrate. Accordingly, the fabricating process is very simple and accurate.

The reason why the polycrystalline silicon layers are used as the diffusion mask, is that the polycrystalline silicon layers can be formed at the relatively low temperature as about 650° C and their diffusion constants are small. The polycrystalline silicon layer containing no oxygen atom has nearly the same diffusion constant as a single crystal silicon layer. The diffusion constant of the polycrystalline silicon layer is remarkably reduced with the content of oxygen atoms. Accordingly, the polycrystalline silicon layer containing oxygen atoms is very favourable for a diffusion mask.

The polycrystalline silicon layer 2 containing oxygen atoms is formed on the surface of the transistor 15. Accordingly, the transistor 15 has an excellent surface passivation effect. On the other hand, a SiO₂ layer as a passivating layer is formed on the surface of a conventional transistor. An undesirable memory function is induced by the electric charge existing in the SiO₂ layer of the conventional transistor. A channel is formed in the semiconductor substrate of the transistor. Moreover, the electric charge is fixed due to the polarization in the shielding resin. As the result, the break-down voltage of the PN-junction is lowered and the reliability is deteriorated by external electric fields. The above described disadvantages of the conventional transistor can be avoided by the polycrystalline silicon layer 2, since the resistivity of the polycrystalline silicon layer 2 is lower than that of the SiO₂ layer. The break-down voltage of the PN-junction is raised by the polycrystalline silicon layer 2. Moreover, since the polycrystalline silicon layer 2 contains a proper quantity of oxygen atoms, the resistivity of the polycrystalline silicon layer 2 is higher than that of a pure polycrystalline silicon layer, so that electric charge is hard to move through the polycrystalline silicon layer 2, and little reverse leak current flows.

Moreover, since the thermal expansion coefficient of the polycrystalline silicon layer 2 is nearly equal to that of the semiconductor substrate 1, the contact between the polycrystalline silicon layer 2 and the semiconductor substrate 1 is not deteriorated by thermal distortion. Accordingly, better passivating effect can be obtained.

In this embodiment, since the polycrystalline silicon layer 3 containing nitrogen atoms is formed on the polycrystalline silicon layer 2, the resistivity against moisture is remarkably improved. In order to test the resistivity against moisture, a diode shown on FIG. 3 was prepared, and the V-I characteristics of the diode were measured before and after the exposure to water vapor. In the diode, the first polycrystalline silicon layer 2 having the thickness of 5000 A, which is grown at the flow ratio of N₂O/SiO₂ = Δ, is formed on the semiconductor substrate 1, and the second polycrystalline silicon layer 3 having the thickness of 2000 A, which is grown at the flow ratio of NH₃/SiH₄ = ⅔, is formed on the first polycrystalline silicon layer 2. One electrode 16 is deposited on the P-type semiconductive region 7, and another electrode 17 is deposited on the bottom surface of the semiconductor substrate 1. The test showed that the reverse break-down voltage $V_B$ was unchanged before and after the exposure to water vapor, and moreover that the intensity of leakage current was low. Accordingly, it has been proved that the polycrystalline silicon layers 3 and 2 are resistive against moisture.

The transistor according to one embodiment of this invention has a good passivating effect, and so it is little deteriorated with the variations of electric bias and temperature. The transistor in which electrodes and external leads are arranged on the SiO₂ layer 9 is improved in stability and reliability with the existence of the SiO₂ layer 9, and particularly can obtain a higher break-down voltage with the existence of the SiO₂ layer 9. The electric charges are prevented from coupling between the SiO₂ layer 9 and the semiconductor substrate 1, by the polycrystalline silicon layers 2 and 3. Accordingly, the influence of the electric charge existing in the SiO₂ layer 9 can be neglected.

It is preferable that the polycrystalline silicon layer 2 contains about 2 to 45 atomic percent of oxygen atoms. 10 to 30 atomic percent of oxygen atoms is desirable for obtaining a remarkable effect. And 13 to 20 atomic percent of oxygen atoms is more desirable. When the polycrystalline silicon layer 2 contains a too small quantity of oxygen atoms, reverse leak currents flow. And when the polycrystalline silicon layer 2 contains a too large quantity of oxygen atoms, the polycrystalline silicon layer 2 is nearly similar to the SiO₂ layer.

It is preferable that the grain size of the polycrystalline silicon is under 1000 A, for example, in the range of about 100 to 200 A. When the grain size is too large, electrons are trapped and stored in the polycrystalline silicon layer, so that a memory phenomenon is encountered and a sufficient stabilization cannot be obtained. And, it is preferable that the polycrystalline silicon layer 3 contains over 10 atomic percent of nitrogen. Under 10 atomic percent of nitrogen, dielectric break-down often occurs on the surface of the polycrystalline silicon layer. There is the possibility that the electrodes are short-circuited and so discharging occurs through the surface of the polycrystalline silicon layer. The property of the polycrystalline silicon containing a too small quantity of nitrogen is nearly similar to that of a pure polycrystalline silicon which has not a sufficient resistivity against water. The polycrystalline silicon may contain a too large quantity of nitrogen. Even the polycrystalline silicon containing nitrogen at the concentration nearly similar to Si₃N₄ has a sufficient resistivity against water.

The thickness $T_1$ of the polycrystalline silicon layer 2 is preferably in the range of $0.15 \mu \leq T_1 \leq 2.0 \mu$. It is proved that the reverse current characteristic after heat treatment are deteriorated when the thickness $T_1$ is smaller than $0.15 \mu$. Since the electrode cannot be satisfactorily formed for a too thick polycrystalline silicon layer, it is preferable that the thickness of the polycrystalline silicon layer is under $2.0 \mu$. And the thickness $T_2$ of the polycrystalline silicon layer 3 is preferably over $0.1 \mu$ in order to obtain a satisfactory resistivity against moisture and to prevent the generation of pin holes. As the result, it is preferable that the added thickness $(T_1 + T_2)$ of the polycrystalline silicon layers 2 and 3 is under $2 \mu$ $(T_1+T_2 \mu\, 2\mu)$, since the electrode can be satisfactorily formed for the polycrystalline silicon layers 2 and 3 having such a thickness.

Figure 3:
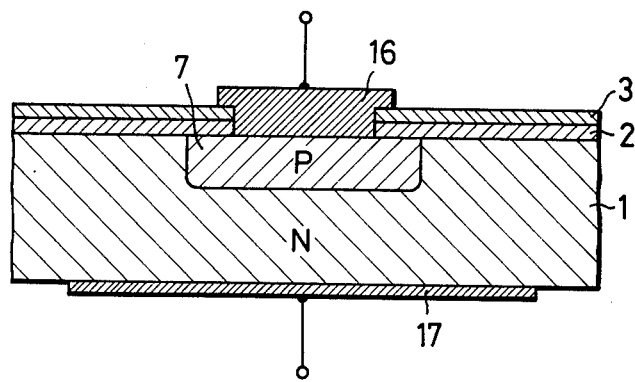
FIG. 3 is a sectional view of a diode produced for testing the characteristics of the polycrystalline silicon layer, according to another embodiment of this invention.

Next, the diode according to another embodiment of this invention will be described with reference to FIG. 3, in more detail.

In the fabrication of the diode, the first and second polycrystalline silicon layers 2 and 3 are successively formed on the semiconductor substrate 1 by the vapor growth method in the same manner as in the above-described embodiment. A predetermined part of the first and second polycrystalline silicon layers 2 and 3 is removed by the plasma-etching method to form an opening therein P-type impurities such as boron atoms are diffused into the semiconductor substrate 1 through the opening. Then, the electrode 16 is deposited on the P-type semiconductive region 7.

In the diffusion operation, the polycrystalline silicon layer 3 containing nitrogen atoms satisfactorily functions as a diffusion mask or a diffusion stopper. The thin $SiO_2$ layer is formed on the semiconductor substrate 1 after the diffusion operation. It can be easily removed by an etching solution of hydrofluoric acid-water, for depositing the electrode. The fabricating process is very simple. It is preferable that the added thickness of the polycrystalline silicon layers 2 and 3 is under 2 $\mu$, as above described. The static characteristics or reverse V-I characteristics of the diode according to this embodiment is nearly equal to those of a conventional diode ($V_B = 70V$). Little leakage current flow.

Next, a MOS-FET according to a further embodiment of this invention will be described with reference to FIG. 4A to FIG. 4E.

Figure 4A:
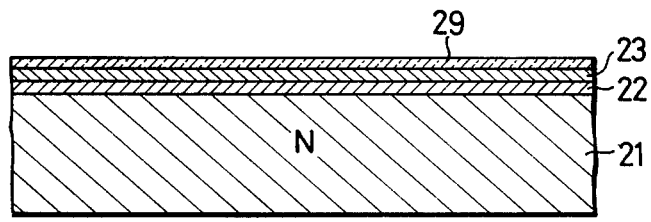
FIG. 4A to FIG. 4E are sectional views in elevation showing progressive stages of a MOS-FET according to a further embodiment of this invention.

As shown on FIG. 4A, a polycrystalline silicon layer 22 containing oxygen atoms is formed on the main surface of an N-type silicon semiconductor substrate 21. A $Si_3N_4$ layer 23 is formed on the polycrystalline silicon layer 22. And a $SiO_2$ layer 29 is formed on the $Si_3N_4$ layer 23. The layer 22, 23 and 29 are formed by the vapour growth apparatus shown on FIG. 2.

Figure 4B:
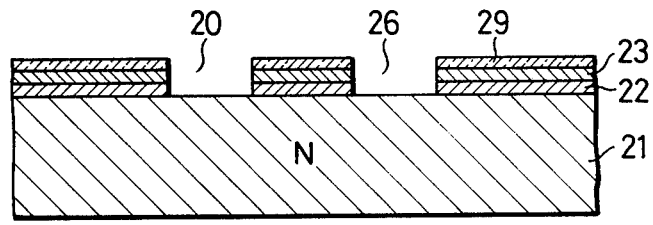
Figure 4C:
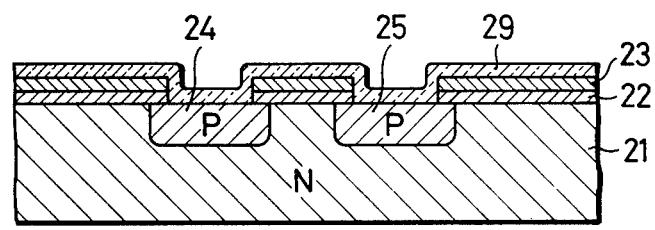
Figure 4D:
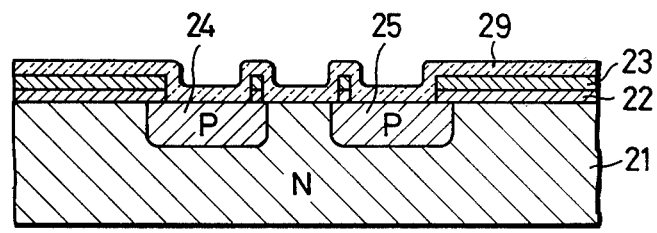

Predetermined parts of the layers 22, 23 and 29 are etched to form openings 20 and 26 therein, as shown on FIG. 4B. P-type impurities such as boron atoms are diffused into the semiconductor substrate 21 through the openings 20 and 26 to form a P-type source region 24 and a P-type drain region 25 therein as shown on FIG. 4C. In that diffusion operation, the $SiO_2$ layer 29 and the $Si_3N_4$ layer 23 function as a diffusion stopper. A thin $SiO_2$ layer is formed at the openings 20 and 26, contiguously to the $SiO_2$ layer 29.

Next, a predetermined part of the layers 22, 23, and 29, extending over a portion (gate region) of the semiconductor substrate between the source region 24 and the drain region 25, is etched to form an opening (not shown) for depositing a gate electrode. And a $SiO_2$ layer as a gate oxidation layer is formed at the opening, contiguously to the $SiO_2$ layer 29 by a thermal oxidation method, as shown on FIG. 4D. It is preferable that the polycrystalline silicon layer 22 and the $Si_3N_4$ layer 23 cover the exposed parts of the PN junction in the main surface of the semiconductor substrate 21 except the exposed parts of the PN-junction in the gate region of the semiconductor substrate 21.

Figure 4E:
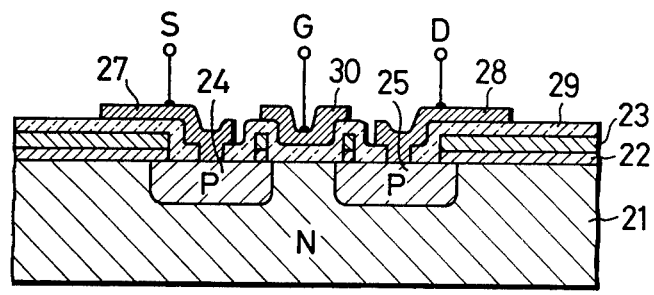

Next, parts of the $SiO_2$ layer 29 extending over the source region 24 and the drain region 25 are etched to form openings which are filled with a source electrode 27 and a drain electrode 28, as shown on FIG. 4E. And a gate electrode 30 is deposited on the gate oxidation layer.

In this embodiment, the $SiO_2$ layer 29 and the $Si_3N_4$ layer 23 function as a diffusion stopper. As in the first embodiment, the three layers including the polycrystalline silicon layer as the passivation layer are not removed from the semiconductor substrate 21, but they remain on the semiconductor substrate 21. Accordingly, the fabricating process is simplified. Moreover, a good passivating effect can be obtained, and resistivity against moisture can be improved. Since the $SiO_2$ layer 29 exists as the uppermost layer in the MOS FET, the electric characteristics between the lead for the gate electrode 30 and the other electrodes become reliable so much. Moreover, since the semiconductor substrate 21 (field portion) outside the source region 24 and the drain region 25 is covered with the polycrystalline silicon layer 22, it is possible to prevent an undesirable channel due to the inversion layer on the surface of the semiconductor substrate 21. For example, in a complementary type MOS FET in which an N-channel MOS FET (not shown) is formed adjacent to the MOS FET shown on FIG. 4E, an undesirable channel is prevented from occuring between the FETs. Accordingly, a so-called channel stopper or a special diffusion region is not required for the complementary type MOS FET according to this invention, and so integration density can be improved. When the polycrystalline silicon layer having a good passivating effect is formed on the field portion of the semiconductor substrate, as in this embodiment, a high Par-Vth (parasitic threshold voltage) such as over 100V can be obtained. In the formation of the N-channel MOS FET, unnecessary diffusion of N-type impurities such as phosphorus atoms can be prevented by the existence of the $SiO_2$ layer 29.

While the invention has been particularly shown and described with reference to preferred embodiments thereof, it will be understood by those skilled in the art that various changes in form and details may be therein without departing from the spirit and scope of the invention.

For example, the concentration of oxygen atoms or nitrogen atoms of the polycrystalline silicon layer may gradually vary in the thickness direction of the polycrystalline silicon layer. The boundary portion between the polycrystalline silicon layers may contain both oxygen atoms and nitrogen atoms. Of course, it is possible to convert the conductivity type of the semi-conductive regions. However, it is preferable that the $SiO_2$ layer exists on the polycrystalline silicon layer containing nitrogen atoms, when the N-type impurities are diffused. Moreover, this invention may be applied to the formation of a PN junction for IC separation. In such a case, for example, when P-type impurities are diffused into an N-type semiconductive layer in the thickness direction thereof, a polycrystalline silicon layer containing nitrogen atoms as the uppermost layer satisfactorily functions as a diffusion stopper.

According to this invention, since the diffusion mask needs not to be removed in the fabrication of the semiconductor device, the fabricating process can be remarkably simplified. Moreover, by the combination of the second polycrystalline silicon layer as the diffusion mask with the first polycrystalline silicon layer having a good passivating effect, the influence of electric charge in a mold resin can be avoided, the semiconductor device is little deteriorated with the variations of electric bias, temperature, and humidity, and it is very superior in stability and reliability.

What is claimed is:

1. A method for fabricating a semiconductor device comprising the steps of;
    forming a first polycrystalline silicon passivation layer containing between 2 and 45 atomic percent of oxygen atoms on a semiconductor layer;

forming a second polycrystalline silicon passivation layer containing more than 10 atomic percent of nitrogen atoms on said first polycrystalline silicon layer;

removing a part of said first and second polycrystalline silicon passivation layers selectively, for making an opening in them; and diffusing impurity material of one conductivity type into said semiconductor layer through said opening in order to form a diffused region.

2. A method for fabricating a semiconductor device according to claim 1 further comprising the step of diffusing impurity material of another conductivity type into said diffused region through an opening formed in an oxidized layer on said diffused region.

3. A method for fabricating a semiconductor device comprising the steps of:

a. forming a first polycrystalline silicon layer containing oxygen atoms between 2 and 45 atomic percent on a semiconductor layer;

b. forming a second polycrystalline silicon layer containing nitrogen atoms more than 10 atomic percent on said first polycrystalline silicon layer;

c. forming a third polycrystalline silicon layer containing oxygen atoms on said second polycrystalline silicon layer.

d. forming a common opening in a part of said first, second and third polycrystalline silicon layer;

e. diffusing impurity material of one conductivity type into said semiconductor layer through said common opening; said third polycrystalline silicon layer being changed to a silicon dioxide layer and another silicon dioxide layer being formed on the exposed surface of said semiconductor layer during said diffusion step;

f. forming an opening into said another silicon dioxide layer on the semiconductor layer; and g. forming an electrode contacting said silicon layer through said opening in said another silicon dioxide layer and extending on said another silicon dioxide layer.

* * * * *